United States Patent [19]

Gabillard et al.

[11] Patent Number: 5,717,696
[45] Date of Patent: Feb. 10, 1998

[54] CIRCUIT FOR TESTING A SEMICONDUCTOR CHIP HAVING EMBEDDED ARRAYS INTERMIXED WITH LOGIC

[75] Inventors: Bertrand Gabillard, Paris; Michel Rivier, Barbizon, both of France

[73] Assignee: International Business Machines Corporation, Armonk, N.Y.

[21] Appl. No.: 391,997

[22] Filed: Feb. 21, 1995

[30] Foreign Application Priority Data

Jul. 7, 1994 [EP] European Pat. Off. ............ 94480057

[51] Int. Cl.$^6$ .................................................. G01R 31/28
[52] U.S. Cl. .............................................. 371/21.4; 365/201
[58] Field of Search ............................. 371/21.4, 21.1, 371/22.5; 324/158 R, 765; 365/201, 189.09, 208, 226; 364/550

[56] References Cited

U.S. PATENT DOCUMENTS

| | | | |
|---|---|---|---|
| 5,283,762 | 2/1994 | Fujishima | 365/189.09 |
| 5,285,119 | 2/1994 | Takahashi | 307/473 |
| 5,294,883 | 3/1994 | Akiki et al. | 324/158 R |
| 5,355,331 | 10/1994 | Takase et al. | 365/154 |
| 5,444,391 | 8/1995 | Moitie et al. | 326/16 |
| 5,491,665 | 2/1996 | Sachdev | 365/201 |
| 5,497,117 | 3/1996 | Nakajima et al. | 327/404 |
| 5,523,977 | 6/1996 | Tobita et al. | 365/201 |

FOREIGN PATENT DOCUMENTS 0 494 311 A1   7/1991   European Pat. Off. .

Primary Examiner—Robert W. Beausoliel, Jr.
Assistant Examiner—Nadeem Iqbal
Attorney, Agent, or Firm—H. Daniel Schnurmann

[57] ABSTRACT

A test circuit applicable to chips having embedded arrays intermixed with logic is described. Depending on a control signal, the test circuit connects or isolates the arrays to and from the logic. The test circuit operates as a switch placed between the power supply rail of the logic and the power supply rail of the arrays. All input gates are cross-connected to the power supply rail of the logic, and each output gate is connected to the corresponding power supply rail of the arrays. During TEST mode, the control signal turns off the test circuit, cutting off the arrays. The logic is tested while the memory cells remain unselected. Faulty chips are rejected. When the value of the control signal is inverted, a control gate connects all the power supply rails of the arrays to the power supply rail of the logic. The test sequence for the embedded array is then applied. Faulty memory cells are replaced with repairable ones; otherwise, the faulty chips are rejected. Thus, the manufacturing yield of the mixed chips is improved.

6 Claims, 5 Drawing Sheets

| (GR) μm | ARRAY SIZE Kbit | CHIP SIZE mm² | REDUNDANT WORDLINE RWL |
|---|---|---|---|
| 1.0 | 144 | 9.25 x 6.3 | 3 WL |
| 1.0 | 128 | 8.8 X 6.9 | 4 WL |
| 0.8 | 256 | 8.8 X 6.9 | 4 WL |

FIG. 1

CIRCUIT FOR TESTING A SEMICONDUCTOR CHIP HAVING EMBEDDED ARRAYS INTERMIXED WITH LOGIC

FIELD OF INVENTION

The present invention relates generally to the test of chips combining a logic network and embedded arrays, and more particularly to a circuit which isolates the logic network from the arrays during test.

BACKGROUND OF THE INVENTION

Present day microprocessors, micro-controllers and the like, mix large arrays with logic circuits networks on the same chip in an arrangement wherein the arrays are embedded within the logic network. Such chips are called mixed chips.

Testing is a key operation during the course of the design of a chip since it represents the last step before chips are mounted on a module, card, board, and ultimately on the system. The test coverage, which is commonly used to determine the extent of a test, is made as complete as possible through the application of large number of test patterns to the chips. In order to reduce time and processing cost, the test efficiency is oftentimes allowed to be less than 100%. In such a case, a probability remains that a chip that has passed the test sequence can fail in a system environment due to untested faults. The proportion of faulty chips which may escape and be erroneously shipped to a customer is typically quantified by an index called the Shipped Product Quality Level (SPQL), which in combination with the manufacturing yield provides a measure of the efficiency of the test.

In the case of products designed with standalone memory chips and separate logic chips, a test sequence is performed for each chip. A logic test sequence is applied to logic chips and faulty ones are rejected. A separate memory test sequence is then applied to the standalone memory chips. Faulty memory chips may be repaired by introducing redundant circuits which are incorporated into the design. Redundancy increases the manufacturing yield of memory chips by replacing faulty word lines or bit lines with redundant ones. A common practice dictates that redundancy be required for arrays that cover approximately 25% of the total chip area. As an example, FIG. 1 illustrates this rule showing the number of recommended redundant word lines for different array sizes (Kbit) within prescribed technology ground rules.

When redundancy is used, a faulty element (i.e., a memory cell, a bit-line or a word-line) is replaced by a corresponding redundant element. This is generally done by blowing fuses that impair a faulty address and replacing it with a redundant one. A typical fault in a logic circuit or memory product creates a conductive path between the high power and the low power supply. Such short circuit draws a DC leakage current, commonly identified as Idd. This leakage current (Idd test) must be lower than a predetermined threshold value. Therefore, a specific test sequence is generated in order to measure the actual Idd value and to compare it to its theoretical value. A particularity which becomes critical in case of mixed chips occurs when this leakage current value is of the same order for the array as it is for the logic network. When the Idd measured for the logic is greater than the measured value of the Idd test, the chip is rejected because there is no possibility of repairing the leaky circuit. In case of a memory chip, the Idd current is likewise compared to the Idd test value. In case of a high current, other tests are performed to test the redundancy. The faulty elements are then replaced by redundant ones. It clearly appears that redundancy offers a significant contribution to improve the manufacturing yield of chips embedding memory products.

Referring to mixed chips, leakage currents may occur in the logic, in the memory or in both, the logic and memory circuits. As previously explained, the theoretical value of the Idd test for logic and for memory is of the same order. It follows that a single Idd test value is taken into account for comparison with the measured value. Furthermore, a single Idd test sequence is generated for the mixed chip. The measured leakage current value needs not be identified, and in case of a higher value than the allowed one, the chip is rejected. Thus, redundancy in arrays is inefficient since most of the faulty chips are rejected, even those where the fault is due to a memory element which could have been repaired. For that reason, some mixed designs do not implement redundancy as there is no way to use it. Thus, the manufacturing yield of mixed chips is impacted and is lower than it could be. The overall quality of the product could be significantly improved if the faulty memory elements were identified and repaired by redundancy. Therefore, there is a need for finding a satisfactory solution to improve the SPQL index in mixed chips. The problem is to identify a fault due to a defect in the logic circuit from a fault due to a defect occurring in the memory unit. One solution is to build a specific test sequence for mixed chips with appropriate tools, such as the one to be described hereinafter. A first Idd test sequence is applied to the chip. If the test is good, i.e., if the Idd value is less than the expected one, the memory test sequence is applied and the chip is sorted depending on whether the memory is good, repairable or not repairable. In case of a high Idd value, the chip is not rejected and a memory test sequence is applied. If a faulty element is detected in the memory, a test for redundancy is applied and the faulty circuit is replaced. At this point, one cannot tell whether the chip is free of defects since a high Idd value may not be indicative of a faulty memory element. By way of example, a bit-line to bit-line short or a word-line to word-line short does not draw any Idd current. This kind of fault can also be detected and corrected by the memory test sequence. In case of this kind of fault occurring, the high leakage current value may still remain after the first repair. So, if this solution is applied, there is no way of ensuring that all faults have been detected prior to shipping. Thus, the SPQL will be degraded. From an economic point of view, this solution is prohibitive because of a degradation in customer satisfaction. Then, a low cost and reliable solution is preferably based on a test sequence which is able to test the logic independently from the memory. Alternatively, the mixed chip is to be tested just as if it were made of two separate chips. It means that test patterns are applied to logic circuits first and high Idd chips are rejected. Then, the Idd test sequence is applied to the memory portion of the only low Idd logic chips. Faulty memory elements can be identified and redundancy used, if necessary.

The following will describe a possible implementation of such a test sequence and its disadvantages. This will be explained with reference to FIG. 2 which illustrates a part of a conventional mixed chip 10 with an embedded array 12 and a logic circuits network 14. The standard embedded array 12 includes a memory unit 12.1 connected to I/O circuits 12.2 (such as drivers/receivers and sense amplifiers) and redundancies 12.3. The logic circuits network 14 that carry data processing operations consists of numerous logic circuits 14.1 to 14.N distributed around the embedded array. Two primary input terminals 16 and 18 are adapted to supply the VDD power supply and GND to the chip through two independent metallized grids, respectively composed of internal VDD (GND) rails distributed in a standard arrangement.

A standard mixed chip 10 has two basic operating modes: the SYSTEM mode for normal operation, and the TEST mode used in a manufacturing environment. In the SYSTEM mode, internal reference voltages are commonly used to maintain a constant DC current in circuits requiring a specified operating mode. Such internal reference is generated by a voltage generator driven by a constant signal LT. LT is delivered through a standard primary input terminal 22 and is set either to a SYSTEM value when DC current is required or to a TEST value during the Idd test sequence to allow a correct measure of the leakage current. For sake of illustration, FIG. 3 shows a CMOS logic circuit 30 controlled by LT. The logic circuit 30 consists of a PFET device receiving the input signal VIN 32, and an NFET device connected in series and receiving a reference voltage Vref. The PFET and the NFET devices are biased between VDD and GND. The reference voltage Vref is generated through a reference voltage generator 34 supplied between GND and a second power supply VDD'. When the reference voltage generator 34 is ON, i.e., in SYSTEM mode, LT is low and Vref is connected to VDD'. Therefore, NFET is ON and drives a constant DC current. VOUT 36 is connected to GND when VIN 32 is high. With the input signal VIN 32 at a low, PFET switches ON, VOUT 36 is high, although at a lower voltage than VDD due to the current flowing through the NFET device.

In the manufacturing environment, i.e., in the TEST mode, the LT value is inverted. Vref is attached to GND and the NFET device switches off. Under such conditions, the constant DC current on the chip is zero, except if faulty circuits are present which dissipate leakage current. The Idd test sequence is thus applied and the leakage currents measured. Good chips are subsequently shipped with the LT pad set at the LT SYSTEM value.

Turning now to the description of a possible test sequence for mixed chips, one solution is to have a plurality of VDD (GND) power supply grids, one VDD (GND) grid for the logic and a second VDD (GND) grid for the array. As it was previously described, the power supply distribution for a VLSI chip requires a standard arrangement for the grids to be technology and design independent. In case of separate grids for the logic and for the memory, the power supply distribution becomes increasingly complex in the presence of more than one embedded array. Such a solution is, therefore, not suitable for mixed chips designed with several embedded arrays.

Thus, it is highly desirable to preserve a common power supply grid both for logic circuits network and for embedded arrays, and to implement a new circuit which separates the logic from the array portion during TEST mode. The logic unit is tested first and the chips are sorted according to the faulty logic. This is followed by testing the embedded arrays of the remaining chips. Such an arrangement allows using redundancy in case of a faulty memory element, and improves the manufacturing yield of mixed chips.

OBJECTS OF THE INVENTION

It is therefore a primary object of the present invention to provide a test circuit to increase the manufacturing yield and to improve the SPQL of semiconductor mixed chips.

It is another object to provide a test circuit for mixed chip which is independent of the location and the number of embedded arrays.

It is yet another object to provide a test circuit which allows to initially power while in TEST mode, first, the logic portion and then the memory portion of mixed chips.

It is a more particular object to provide a test circuit to sort mixed chips according to a faulty logic or a faulty memory.

It is a further object to provide a method for testing mixed chips having a high reliability-to-cost ratio.

SUMMARY OF THE INVENTION

According to the basic principles of the present invention a test circuit for mixed chips is provided which includes at least one embedded array within a logic circuit network.

Such a semiconductor chip has two standard operating modes, a SYSTEM mode for normal operations and a TEST mode for the manufacturing environment.

The present invention provides a test circuit which fully isolates the memory unit of embedded arrays from the logic circuit network in TEST mode and which connects the embedded arrays to the logic circuit network while in SYSTEM mode. This permits applying the logic test sequence to only the logic portion of the chip, and to reject faulty ones. The memory unit is then tested on the remaining good chips. In case of a faulty memory element, a redundant circuit is used to replace the faulty array. This permits increasing the manufacturing yield of the mixed chips.

BRIEF DESCRIPTION OF THE DRAWINGS

The features believed to be characteristic of this invention are set forth in the claims. The invention itself, however, as well as other objects and advantages thereof, may be best understood by reference to the following detailed description of illustrated preferred embodiment to be read in conjunction with the accompanying drawings in which:

FIG. 1 shows a conventional number of redundant memory elements commonly used for several array size configurations;

DESCRIPTION OF THE PREFERRED EMBODIMENT

As previously noted, the main object of the invention is to test the memory portion of a mixed chip, independently from the logic. This is implemented through a test circuit which first powers the logic circuits network as well as the I/O circuits of the arrays, and further powers the memory cells of the embedded arrays. This allows testing first the logic and then the memory. Furthermore, the present solution takes advantage of an existing signal LT currently used for test purposes in standard VLSI chips.

As described in the prior art, redundant circuits are used for repairing faulty elements of a memory unit, generally comprising rows or columns of memory cells. Other circuits of the array, i.e., the I/O circuits, are not duplicated and, therefore, cannot be repaired. Thus, the I/O or peripheral circuits can be tested during the course of the same Idd test sequence as the logic circuits network. Therefore, the test circuit of the invention isolates the memory cells of the embedded arrays from all the others circuits of the chip during TEST mode. The test circuit operates as a switch which connects or isolates the memory unit from the logic circuits network according to a control value. The test circuit is placed between the power supply rail of the memory cells and the power supply rail of the logic circuits, and is controlled by the LT signal. The power supply rails are isolated when the chip is in TEST mode and are connected when the chip is in SYSTEM mode. During TEST mode, the TEST value of LT is applied to the control gate of the test circuit, turning it off. The power supply rails are isolated, leaving only the logic circuits and the I/O circuits supplied with the current, whereas the memory unit is essentially cut off. Therefore, the Idd test sequence is applied only to all logic circuits, and a first sort is made to identify faulty logic chips. The LT signal value is then inverted. The test circuit turns on power to the logic network and to the memory unit. The memory cells are selected and the Idd test sequence is initialized for the array. A second sort is then performed according to whether the faulty element is repairable or not. With the use of redundancy, the production of good chips is thus improved. At this point, the rejected chips are those chips having faulty logic circuits and those having unrepaired memory cells.

Another major aspect of the invention is to optimize the location of the test circuit on the chip. One test circuit is implemented for each row or column of memory cells, instead of one test circuit for the whole memory unit. This choice offers better automation in the design of arrays since the test circuit is integrated in the design of each row or column of cells. As the design of chips becomes more complex and dense, one chip can mix several arrays of different sizes. This invention allows that the design of the test circuit remain unchanged and independent of the number of rows or columns of the memory unit.

Figure 2:
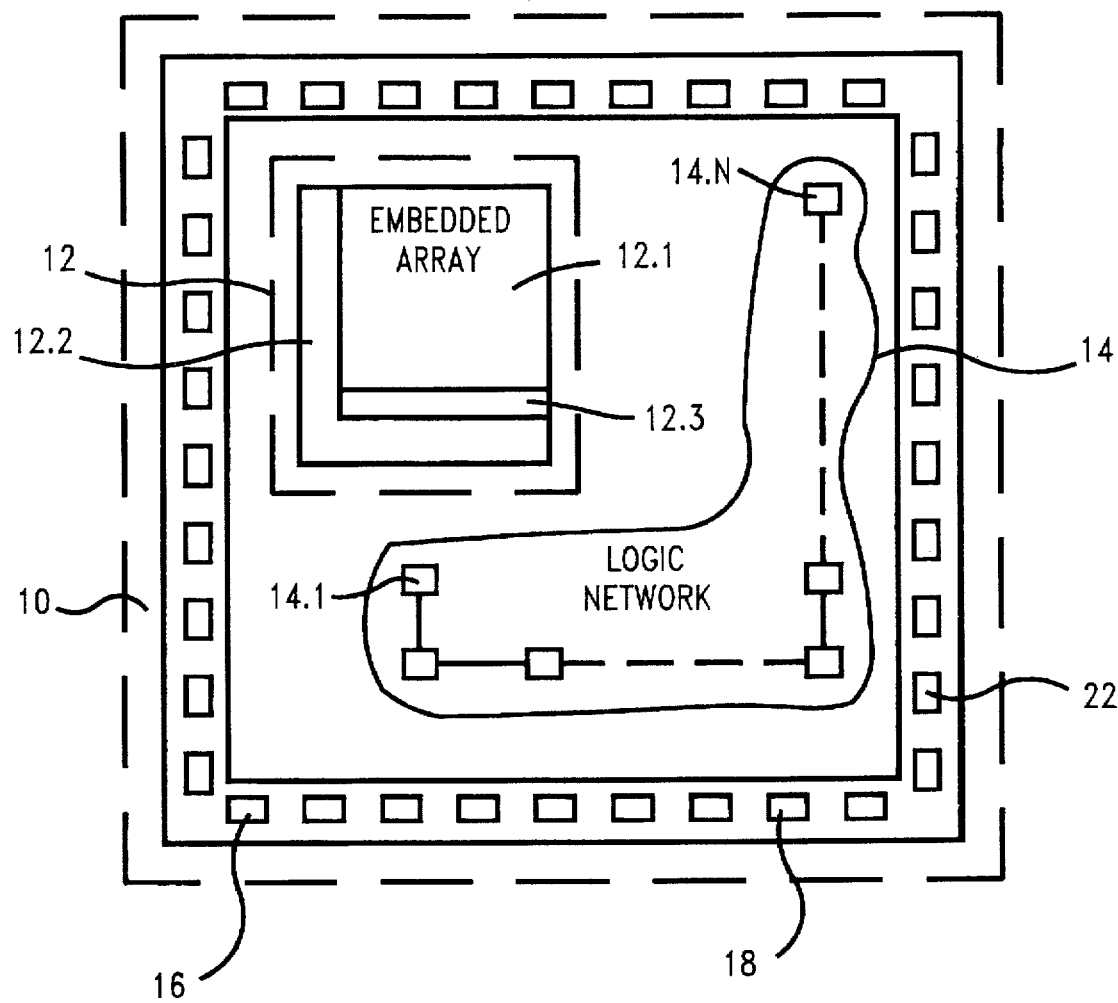
FIG. 2 shows a state of the art mixed chip having embedded arrays and logic circuit network.
Figure 3:
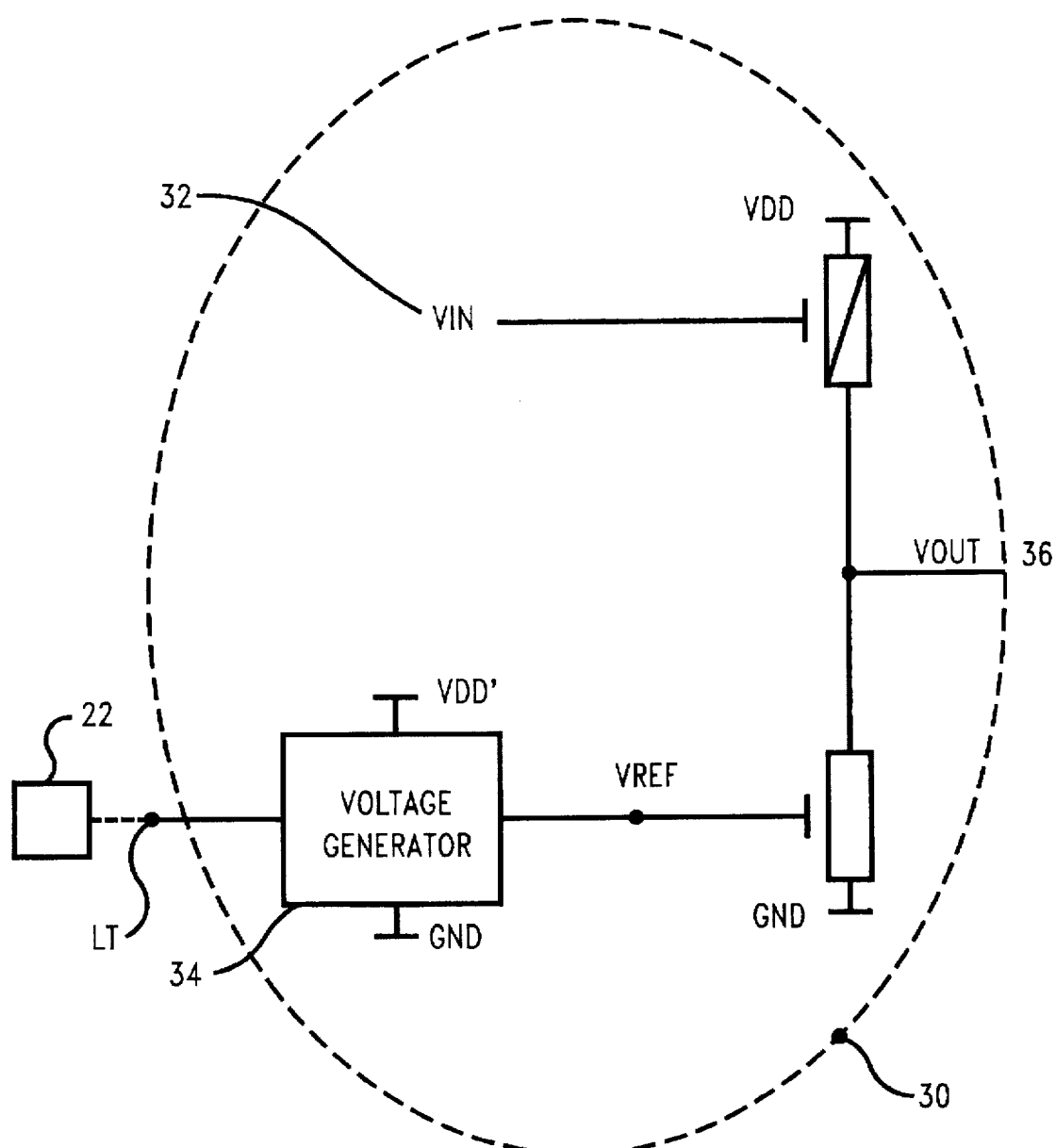
FIG. 3 illustrates a state of the art logic circuit driven by the LT signal in the standard CMOS technology.
Figure 4:
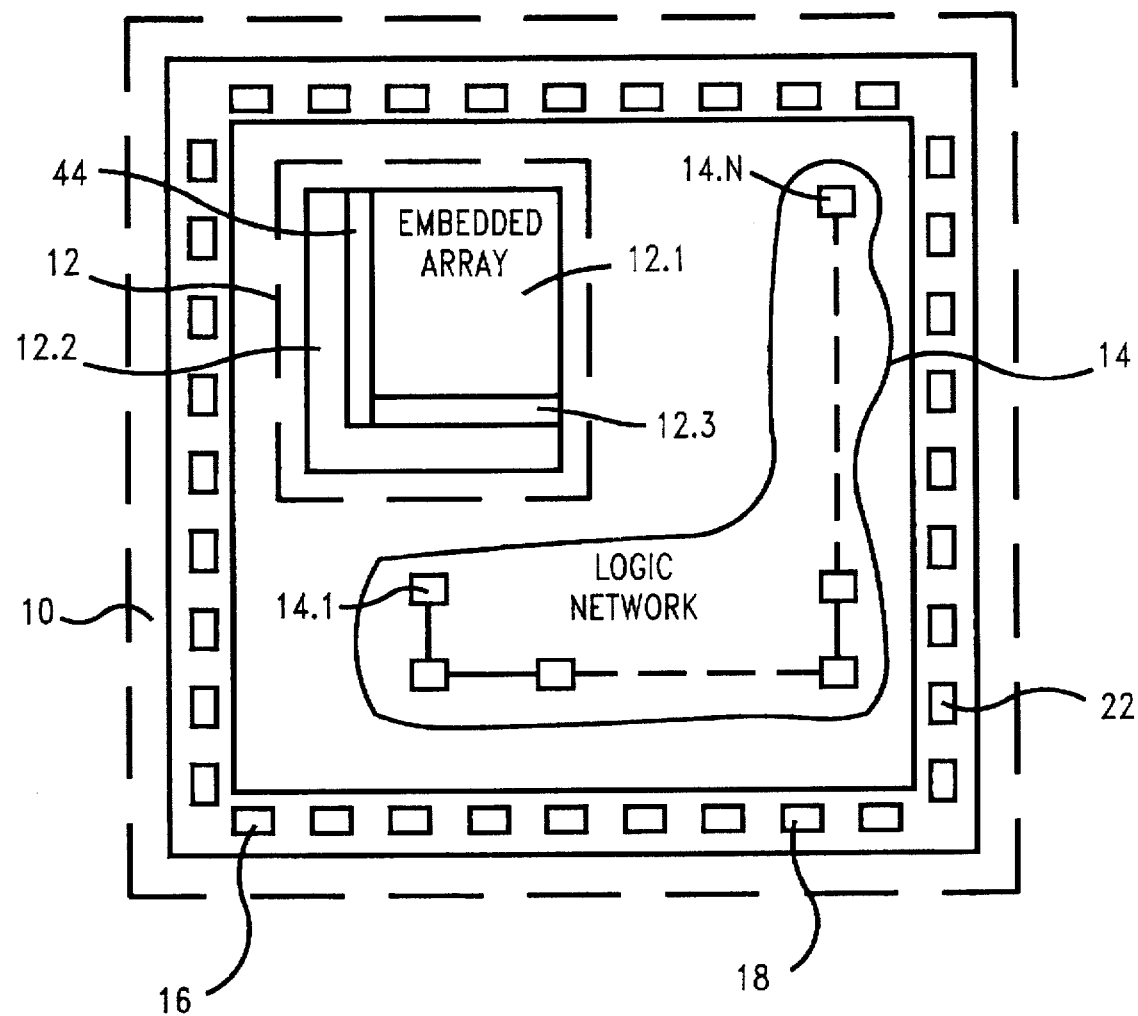
FIG. 4 shows the hardware implementation of a standard mixed chip in accordance with the present invention.
Figure 5:
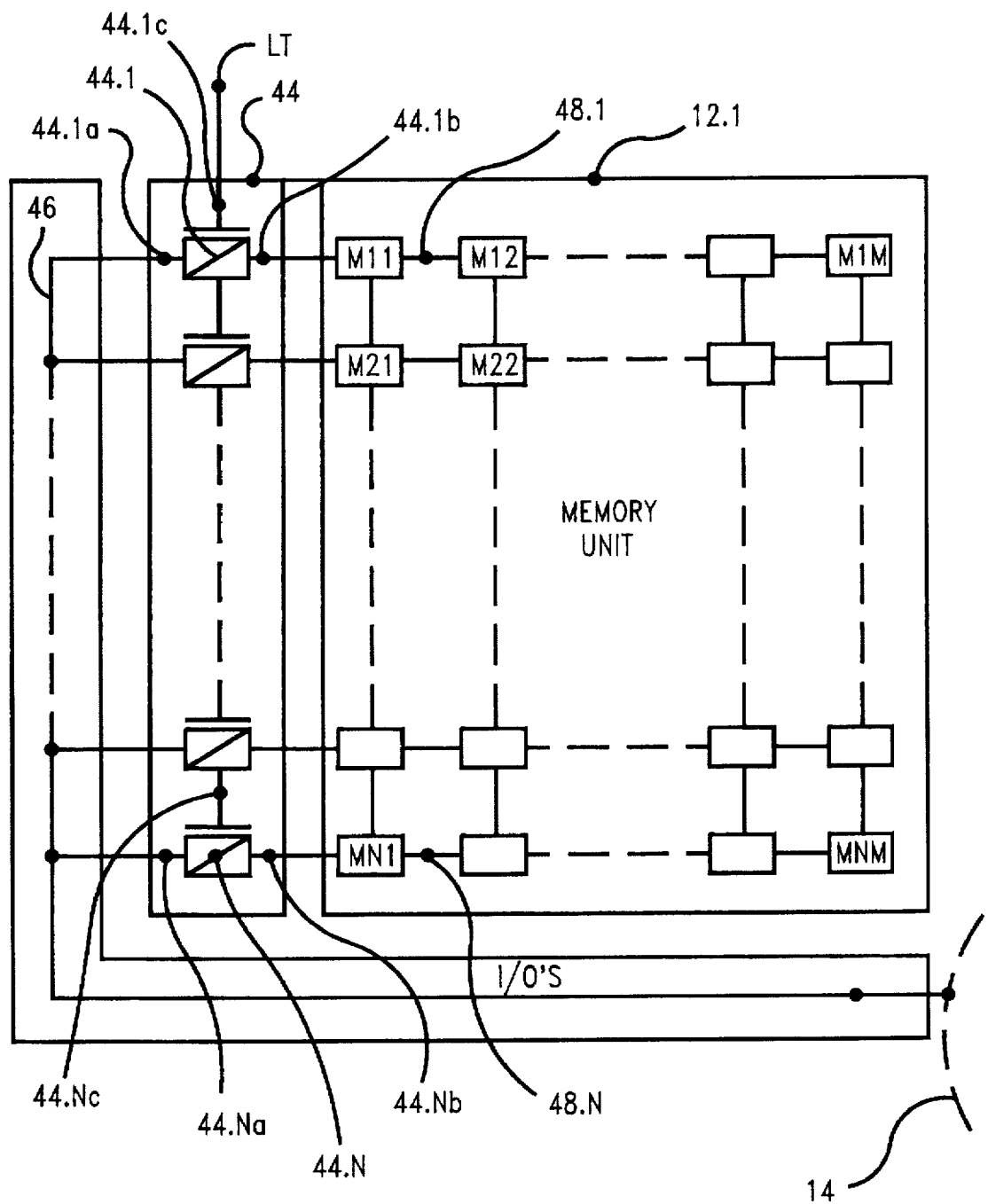
FIG. 5 shows a hardware implementation of the test circuit of the present invention, in case of a VDD power supply separation.

Referring to FIGS. 4 and 5, it is respectively shown a state of the art mixed chip intertwined with the invention and a detailed view of the test circuit. In a preferred embodiment, the test circuit is placed on the VDD power supply rail. For a (N rows×M columns) memory unit 12.1 of a standard embedded array 12, a test circuit 44 made of N test elements 44.1 to 44.N, is implemented. Each test element 44.1 is made of a PFET device having an input gate 44.1a, an output gate 44.1b, and a control gate 44.1c. The input gate 44.1a is connected to the VDD power supply rail 46 which supplies power to the logic circuits network 14 and to the I/O circuits 12.2. The output gate 44.1b is connected to the VDD power supply rail 48.1 of the corresponding row of the memory unit 42. The control gate 44.1c receives the LT signal. All input gates 44.1a to 44.Na of the N PFET devices are cross-connected, and each output gate 44.1b to 44.Nb of the N PFET devices is, respectively, connected to each VDD power supply 48.1 to 48.N of each row of the memory unit 42. All the control gates 44.1c to 44.Nc are simultaneously driven by the LT signal.

When the chip operates in TEST mode, LT stands at a high value, the control gates 44.1c to 44.Nc are connected to VDD, and the N PFET devices are switched off. Therefore, no connection exists between the VDD power supply rail of the logic circuits network 46 and the power supply rails 48.1 to 48.N of the memory unit. The memory cells are fully isolated and no selection is possible. The Idd test sequence is then only applied to the logic network 14 and to the I/O circuits 12.2 of the array. Faulty logic chips are rejected. Low Idd logic chips are then supplied while in SYSTEM mode in order to test the embedded arrays.

When LT is supplied while in SYSTEM mode, the N PFET devices turn ON, and the VDD power supply rail 46 of logic supplies power to the rails affecting the memory unit, leading that all the memory cells are supplied with VDD. The array test sequence is then applied. High Idd chips and unrepaired chips are rejected. Good chips are shipped with LT set to the SYSTEM mode value, allowing full connection between logic circuits network 14 and embedded array 12.

Although the present implementation has been described with reference to a test circuit formed by a PFET device connected to the row of the memory unit through the VDD power supply rail, and controlled by the LT signal, it is fully applicable to a test circuit formed by an NFET device connected to the column of the memory unit through the GND rail and controlled by the inverted LT signal.

Some advantages resulting from the test circuit of the present invention include:

An important cost reduction due to a significant decrease of SPQL;

An improved manufacturing yield due to an optimum use of redundancy;

No logic circuitry required to test the chip;

No changes in the design of a regular power supply distribution;

No additional inputs need to be added for driving the inventive circuit. (All inputs of the chip are fixed in the original design); and The same test tools and test sequences can be alternatively used for separate logic chips and array chips.

While the present invention has been particularly described with reference to a preferred embodiment thereof, it will be understood by those skilled in the art that various changes in form and detail may be made therein without departing from the spirit and scope of the invention.

What is claimed is:

1. A semiconductor chip biased between a first and a second power supply voltage, said chip having a system mode and a test mode, comprising, a logic circuit network;

at least one array embedded in said logic;

a first primary input terminal supplying the first power supply voltage, a second primary input terminal supplying the second power supply voltage and a third primary input terminal for generating a control signal to provide IDD test measurements when said semiconductor chip is in test mode, said control signal providing an internal reference voltage when said semiconductor chip is in system mode; and a test circuit responsive to said control signal for isolating without electrically disconnecting said at least one array from said logic circuit network when said semiconductor chip is in test mode, said test circuit being further responsive to said control signal connecting said at least one array to said at least logic circuit network when said semiconductor chips is in system mode.

2. The semiconductor chip as recited in claim 1, wherein said at least one array is comprised of a memory unit having N rows and M columns.

3. The semiconductor chip as recited in claim 2, wherein said memory unit is connected to a power supply rail.

4. The chip as recited in claim 2, wherein said test circuit further comprises N PFET devices, each said devices having an input gate, an output gate and a control gate, wherein:

said first voltage is applied to said input gate;

said output gate is connected to said power supply rail attached to each of said rows of said memory unit; and said control signal is applied to said control gate.

5. The semiconductor chip as recited in claim 2, wherein said test circuit further comprises M NFET devices, each said devices having an input gate, an output gate and a control gate, wherein:

said second voltage is applied to said input gate;

said output gate is connected to said power supply rail attached to each of said columns of the said memory unit; and said control signal is applied to said control gate.

6. The semiconductor chip as recited in claim 1 wherein said at least one embedded array is further provided with redundancy.

* * * * *